(12) United States Patent
Chiba et al.

(10) Patent No.: US 9,373,823 B2
(45) Date of Patent: Jun. 21, 2016

(54) ORGANIC ELECTRONIC DEVICE AND METHOD FOR MANUFACTURING THE SAME

(75) Inventors: Takayuki Chiba, Yonezawa (JP); Yang Yang, Yonezawa (JP); Yong-Jin Pu, Yonezawa (JP); Junji Kido, Yonezawa (JP)

(73) Assignee: NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 0 days.

(21) Appl. No.: 14/119,098

(22) PCT Filed: Aug. 11, 2011

(86) PCT No.: PCT/JP2011/068357
§ 371 (c)(1),
(2), (4) Date: Nov. 20, 2013

(87) PCT Pub. No.: WO2012/160714
PCT Pub. Date: Nov. 29, 2012

(65) Prior Publication Data
US 2014/0084280 A1    Mar. 27, 2014

(30) Foreign Application Priority Data
May 20, 2011 (JP) .................................. 2011-113286

(51) Int. Cl.
*H01L 51/56* (2006.01)
*H01L 51/50* (2006.01)
*H01L 51/00* (2006.01)

(52) U.S. Cl.
CPC ............ *H01L 51/56* (2013.01); *H01L 51/5012* (2013.01); *H01L 51/5072* (2013.01);
(Continued)

(58) Field of Classification Search
CPC ......... H01L 29/08; H01L 51/54; H01L 23/32; H01L 51/50; H01L 51/52; H01J 63/04; H01J 1/63; H01J 1/62; H05B 33/00; H05B 33/02
See application file for complete search history.

(56) References Cited

U.S. PATENT DOCUMENTS

| 4,841,293 A | 6/1989 | Takimoto |
| 2005/0101064 A1* | 5/2005 | Yamazaki et al. ............ 438/149 |

(Continued)

FOREIGN PATENT DOCUMENTS

| JP | 62-203389 A | 9/1987 |
| JP | 2006-019678 A | 1/2006 |

(Continued)

OTHER PUBLICATIONS

International Search Report (PCT/ISA/210) mailed on Nov. 22, 2011, by the Japanese Patent Office as the International Searching Authority for International Application No. PCT/JP2011/068357.

(Continued)

*Primary Examiner* — Fernando L Toledo
*Assistant Examiner* — Lawrence-Linh T Nguyen
(74) *Attorney, Agent, or Firm* — Buchanan, Ingersoll & Rooney PC

(57) ABSTRACT

In a coating-type electron injection layer or electron transport layer using a metal oxide, the present invention aims at improving uniformity or stability of composition distribution and adhesion with another adjoining constituent layer, and improving film forming property, to thereby provide an organic electronic device and manufacture of the device whose efficiency is improved. In the organic electronic device having one pair of electrodes on a substrate, and having at least one organic layer between the electrodes, the electron injection layer or the electron transport layer is formed by application of a liquid material in which an alkaline metal salt and zinc-oxide nano particles are dissolved in alcohol.

8 Claims, 7 Drawing Sheets

(52) U.S. Cl.
CPC ......... *H01L51/5092* (2013.01); *H01L 51/0003* (2013.01); *H01L 51/0039* (2013.01); *H01L 2251/303* (2013.01); *H01L 2251/5369* (2013.01)

(56) References Cited

U.S. PATENT DOCUMENTS

| | | | |
|---|---|---|---|
| 2006/0081840 A1* | 4/2006 | Mori et al. | 257/40 |
| 2006/0188745 A1* | 8/2006 | Liao | H01L 51/5278 428/690 |
| 2007/0228356 A1 | 10/2007 | Makiura et al. | |
| 2010/0012178 A1* | 1/2010 | Yang et al. | 136/256 |
| 2010/0133573 A1* | 6/2010 | Nowatari et al. | 257/98 |

FOREIGN PATENT DOCUMENTS

| | | | |
|---|---|---|---|
| JP | 2008-244387 A | 10/2008 | |
| JP | 4273132 B2 | 6/2009 | |
| JP | 2009-212238 A | 9/2009 | |
| JP | 2010-003618 A | 1/2010 | |
| WO | WO 2006/126407 A1 | 11/2006 | |
| WO | WO 2009/149860 A2 | 12/2009 | |
| WO | WO 2011/005859 A2 | 1/2011 | |

OTHER PUBLICATIONS

Written Opinion (PCT/ISA/237) mailed on Nov. 22, 2011, by the Japanese Patent Office as the International Searching Authority for International Application No. PCT/JP2011/068357.

Office Action issued on Nov. 27, 2014, by the Korean Patent Office in corresponding Korean Patent Application No. 10-2013-7033706. (4 pages).

Office Action issued on May 28, 2015, by the Chinese Patent Office in corresponding Chinese Patent Application No. 201180071032.5. (7 pages).

* cited by examiner

ORGANIC ELECTRONIC DEVICE AND METHOD FOR MANUFACTURING THE SAME

TECHNICAL FIELD

The present invention relates to a coating-type organic electronic device, in which a film forming property is improved, and a method for manufacturing the same, the organic electronic devices including an organic electroluminescence element (hereinafter abbreviated to organic EL element), an organic transistor, an organic thin film solar cell, etc.

BACKGROUND ART

Methods of forming constituent layers, such as an organic layer, in production of organic electronic devices including an organic EL element, is loosely divided into dry processes by way of a deposition method etc., and wet processes by way of a coating method using a solution in which an organic material is dissolved in an organic solvent.

The dry process has an advantage that a uniform film can be formed to have a desired film thickness since an organic material and a metal are usually formed as films under a high vacuum of $10^{-4}$ to $10^{-6}$ Pa, substantially without ingress of moisture, oxygen, or impurities. Further, since the organic material, the metal oxide, and the metal can be formed as films continuously, it is easy to attain a high efficiency of an element and optimization of an element structure by providing each layer with discrete function. While, it has a problem in that uniform film forming in a large area is difficult, a material usage efficiency is low, and it is costly.

On the other hand, the wet process has a comparatively simple film forming process, is less costly, is of a large area, and allows flexible film forming, therefore attracts attention in recent years. Further, it is used in research and development of organic electronic devices, not only an organic EL element but also an organic transistor, an organic thin film solar cell, etc.

As examples of particular techniques, there may be mentioned coating methods including a spin coating method, a casting method, a spray method, etc., as well as immersing methods including a dip method, a self-organization method, the LB method, etc., and printing methods including an ink-jet method, a screen printing method, a roll-to-roll method, etc.

In the coating method by way of a spin coating method, film forming is performed to have a desired film thickness by dissolving an organic material in various solvents and controlling an amount of dropping and a concentration of the solution, a number of revolutions of a spin coater etc., in the atmosphere or under an inert gas atmosphere, such as in a glove box.

In such coating-type organic electronic devices, since a usual film forming material is soluble in an organic solvent, there is concern that a lower layer may be re-dissolved and mixed with an upper layer when stacking a coated film.

Therefore, in the organic EL element, for example a stacking method of using different solvents is employed in which polythiophene-polystyrene sulfonic acid (PEDOT:PSS) which is insoluble in an organic solvent and soluble in water is formed as a film on an ITO substrate, on which a luminescence layer is formed as a film by coating an organic solvent solution, containing an aromatic high-molecular material etc.

Further, it is often the case that an organic material used in a coating-type organic electronic device is unipolar, i.e., it has an electric charge transport property which allows transport of either holes or electrons. This follows that there is electric charge which passes to an electrode and does not contribute to electric charge recombination. Thus, there is a problem that such low carrier balance causes the organic electronic device to reduce its efficiency.

Furthermore, the electron injection layer in the coating-type organic electronic device conventionally employs Ba, Ca, etc. which are water-soluble or alcohol-soluble and are metals with lower work function are used and combined with Al, but they tend to be influenced by moisture or oxygen in the atmosphere, since such metals are very active.

Therefore, in order to attain a high efficiency of the coating-type organic electronic device, there is a need for an electron injection layer or an electron transport layer that can prevent the electric charge from passing through due to its stack structure, and is stable and applicable in the atmosphere.

Then, as for the alcohol-soluble electron injection material or electron transport material, the present inventors have paid attention to cesium carbonate ($Cs_2CO_3$), alkaline metal salts including lithium phenolate salts, such as sodium 8-quinolinolate (hereinafter abbreviated to Naq) shown in the following (Chemical Formula 1), lithium 8-quinolinolate (hereinafter abbreviated to Liq), lithium 2-(2-pyridyl)phenolate (hereinafter abbreviated to Lipp), lithium 2-(2',2''-bipyridine-6'-yl)phenolate (hereinafter abbreviated to Libpp), etc., and zinc oxides (ZnO).

[Chemical Formula 1]

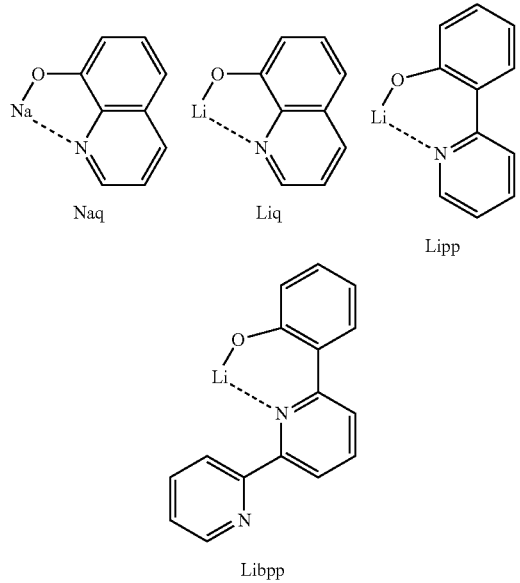

As for $Cs_2CO_3$, it is known that Cs metal is caused by deposition heat and an alcohol-based solvent to separate and functions as an n-dopant, so that an electron injection barrier is lowered and a good electron injection property is demonstrated in either the deposition method or the coating method.

Further, Patent Document 1 describes that provision of a predetermined aryl compound having a PO group and Cs ion or Ca ion dissolved in alcohol at a predetermined rate can improve an electron injection performance and an electron transport performance.

On the one hand, with respect to ZnO, an example has been reported in which a metal oxide, such as ZnO, $TiO_2$, etc. being stable and conductive in the atmosphere is applied to the electron injection layer. According to this, a precursor of the above-mentioned metal oxide is spray-coated, then sintered at a high temperature (around 400 to 500° C.) for a long time (around several hours) to generate an oxide on the ITO substrate. However, the method of employing such a high temperature sintering process causes the organic layer to change and decompose, and therefore is difficult to apply to film formation on the organic layer and limited to an inverted type element structure.

On the other hand, with respect to film forming by a coating method without needing a high temperature sintering process, Patent Document 2 describes that, use of an organic-inorganic hybrid material in which ZnO particles and a predetermined aryl compound having a PO group are hybridized can improve the electron injection performance and the electron transport performance without using an alkaline metal, an alkaline-earth metal, and a compound thereof.

PRIOR ART DOCUMENTS

Patent Documents

Patent Document 1: Japanese Patent No. 4273132
Patent Document 2: Japanese Patent Application Publication No. 2009-212238

SUMMARY OF THE INVENTION

Problems to Be Solved by the Invention

The method described either in Patent Document 1 or 2 above is such that a hybrid material in which the alkaline metal, the alkaline earth metal for the electron injection material or electron transport material, or ZnO is hybridized with the predetermined aryl compound having the PO group is made to be soluble in alcohol and applied.

However, there is a problem that in the case where the electron injection layer is formed of such materials, when an electrode is formed thereon by a vacuum deposition method etc., sufficient adhesion of an electrode film is not obtained, and concentration distribution of the above-mentioned electron injection material in the electron injection layer tends to become uneven.

Further, for example, when arranging a multi-photon structure where a plurality of luminescence layers are stacked in the organic EL element, it is necessary to form an organic layer on the electron injection layer or the electron transport layer which is made of the above-mentioned material. However, a surface of the electron injection layer or the electron transport layer may be dissolved in the solvent used and may be roughened, the organic layer formed thereon may become easy to exfoliate, and it cannot be said that adhesion and stability of the film are sufficient.

Therefore, in the case where a metal oxide is used as the coating-type electron injection material or the electron transport material, when the organic electronic device is formed, it is desired that a film excellent in the uniformity of composition distribution be formed and be excellent in stability and adhesion with other adjacent constituent layers.

The present invention has been made to solve the above-mentioned technical problems, aims to improve the uniformity of the composition distribution or stability and adhesion with other adjacent constituent layers in the coating-type electron injection layer or electron transport layer using the metal oxide, thus improving the film forming property, and to provide the organic electronic device whose efficiency is improved and the method of manufacturing it.

Means for Solving the Problems

The organic electronic device in accordance with the present invention is an organic electronic device having a pair of electrodes on a substrate, and having at least one organic layer between the above-mentioned electrodes, characterized by comprising an electron injection layer or electron transport layer formed of a coated film of an alkaline metal salt and zinc-oxide nano particles.

By forming the electron injection layer or electron transport layer of such a coated film, it is possible to aim to improve a film forming property in a coating-type organic electronic device, to thereby improve device efficiency.

In the above-mentioned organic electronic device, $Cs_2CO_3$, Naq, or a lithium phenolate salt of either Liq, Lipp, or Libpp is used suitably, because it functions as an n-dopant for the above-mentioned alkaline metal salt and is excellent in the electron injection property.

Further, it is preferable that the above-mentioned coated film contains an organic polymer binder.

By adding such an organic polymer binder, it is possible to form a homogeneous and stable film to have a suitable film thickness.

Poly(4-vinylpyridine), poly(2-vinylpyridine), or polyethylene oxide are suitably used for the above-mentioned organic polymer binder in terms of, such as for example, solubility in alcohol, dispersibility and film forming property of the alkaline metal salt and the ZnO nano particles.

Further, as for the above-mentioned organic electronic device, it is preferable that the above-mentioned organic layer includes a stack type structure where a plurality of active layers are stacked.

While holding the uniformity of these layers, such an electron injection layer or electron transport layer can improve adhesion with an adjacent layer and allow stable film forming, so that improvement in efficiency in a stack type organic electronic device can also be attained effectively.

In particular, it is preferable that the above-mentioned organic electronic device is an organic EL element and the above-mentioned organic layer has the multi-photon structure where a plurality of luminescence layers are stacked.

Further, the method of manufacturing the organic electronic device in accordance with the present invention is characterized by performing formation of the electron injection layer or electron transport layer by coating a liquid in which a material is dissolved in alcohol in the method of manufacturing the organic electronic device as described above.

According to such coating method, the organic electronic device as described above can be obtained suitably.

Effects of the Invention

According to the present invention, in the coating-type electron injection layer or electron transport layer using the metal oxide, it is possible to aim at improving the uniformity or stability of the composition distribution and the adhesion with another adjoining constituent layer, and improving the film forming property, to thereby construct the organic electronic device whose efficiency is improved. Further, the present invention can suitably be applied to the device arrangements, such as the hybrid stack structure in which "deposition/coating" and "organic/inorganic" are combined, the stack type structure, and the multi-photon structure.

Furthermore, such organic electronic devices in accordance with the present invention can suitably be obtained according to the manufacture method in accordance with the present invention.

MODE FOR CARRYING OUT THE INVENTION

Figure 1:
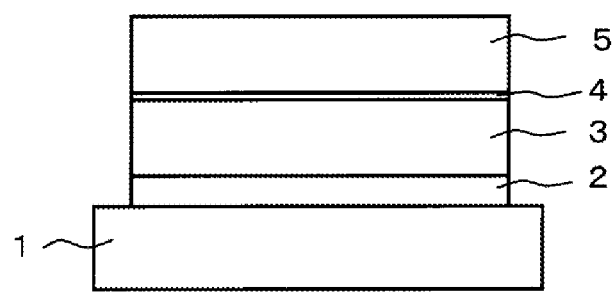
FIG. 1 is a schematic sectional view schematically showing a layer structure of an organic EL element in accordance with Samples 1 to 6 in Examples.

Hereinafter, the present invention will be described in detail.

An organic electronic device in accordance with the present invention is characterized by having one pair of electrodes on a substrate, having at least one organic layer between the above-mentioned electrodes, and having an electron injection layer or an electron transport layer formed of a coated film of an alkaline metal salt and zinc-oxide nano particles.

By organic electronic device as used in the present invention we mean an electronic device provided with a stack structure having an organic layer, and the term is collectively used for an organic EL element, an organic transistor, and an organic thin film solar cell, etc.

In a coating-type organic electronic device, since an electron injection layer or an electron transport layer is formed of such a coated film, it is possible to improve a film forming property. In particular, in the case where coated films or deposition films are stacked, it is possible to maintain uniformity (i.e., homogeneity) of composition distribution of the above-mentioned electron injection layer or electron transport layer, and improve the stability and adhesion of these layers and adjoining layers. Thereby, it is possible to improve device efficiency as a result.

A layer structure of the organic electronic device in accordance with the present invention provided with such an electron injection layers or electron transport layer has a structure in which one pair of electrodes are provided on the substrate, and at least one organic layer is provided between the above-mentioned electrodes. Examples of such layer structures of the organic EL element include in particular structures of "anode/luminescence layer/electron injection layer/cathode", "anode/hole transport layer/luminescence layer/electron transport layer/cathode", "anode/hole injection layer/hole transport layer/luminescence layer/electron transport layer/electron injection layer/cathode", "anode/hole injection layer/hole transport layer/luminescence layer/hole inhibition layer/electron transport layer/electron injection layer/cathode", etc. Further, it may be a known stack structure including a hole transport luminescence layer, an electron transport luminescence layer, etc.

Of the constituent layers of the above-mentioned organic electronic device, the layers other than the electron injection layer and the electron transport layer in accordance with the present invention can use a film forming material which is not particularly limited but suitably selected from well-known ones, and it may be either a low molecular weight material or a polymeric material.

Although a film thickness of each of the above-mentioned layers is suitably and optionally determined in consideration of the adaptability of each layer, the whole layer thickness as desired, etc., it is usually preferable that it is within a range of from 5 nm to 5 µm.

Methods for forming the above-mentioned layers may be dry processes, such as a deposition method, a sputtering method, etc., and wet processes, such as an ink-jet method, a casting method, a dip coating method, a bar coating method, a blade coating method, a roll coating method, a photogravure coating method, a flexographic printing method, and a spray coating method.

However, the electron injection layer or electron transport layer in the organic electronic device in accordance with the present invention is the coated film which can improve the film forming property as described above, and it is preferable that it is formed by applying a liquid material in which an alkaline metal salt and ZnO nano particles (which are coating-type electron injection material or electron transport material) are dissolved in alcohol.

Examples of the above-mentioned alkaline metal salt include $Cs_2CO_3$, $Rb_2CO_3$, $K_2CO_3$, $Na_2CO_3$, $Li_2CO_3$, CsF, RbF, KF, NaF, LiF, etc., but $Cs_2CO_3$ is particularly preferred.

As for $Cs_2CO_3$, Cs metal is separated by an alcohol-based solvent and functions as an n-dopant so that an electron injection barrier is reduced to show a good electron injection property, thus being a suitable coating-type electron injection material or electron transport material.

Further, as the above-mentioned alkaline metal salt, it is possible to suitably use an alkaline metal phenolate salt among alkaline metal complexes. Particularly, Naq which is a sodium phenolate salt, as well as Liq, Lipp, and Libpp which are lithium phenolate salts can also be suitably used. While $Cs_2CO_3$ is deliquescent and unstable in the atmosphere, the above-mentioned alkaline metal phenolate salt has an advantage that it is not only excellent in coating and film forming properties but also stable in the atmosphere, and allows the element production to be easy.

Further, ZnO nano particles are highly conductive, have high hole block properties (HOMO 7.4 eV), are soluble in alcohol, and therefore can suitably be used as the coating-type electron injection material or the electron transport material. Furthermore, it is possible to easily obtain nano particles having a particle diameter of the order of nm by way of a well-known synthesis method as will be described later (see Sample 2 in Examples).

It is preferable that a particle diameter of the above-mentioned ZnO nano particles is 1 to 30 nm. If the above-mentioned particle diameter is less than 1 nm, the particles are chemically unstable, this is not preferred in terms of driving the device stably. On the other hand, if the particle diameter exceeds 30 nm, the particles have inferior smoothness of a thin film to be formed, and it becomes difficult to form a good film.

More preferably, the particle diameter of the above-mentioned ZnO nano particles is 1 to 10 nm.

Further, it is preferable that the coated film of the above-mentioned electron injection layer or the electron transport layer contains an organic polymer binder.

By adding an organic polymer as a binder into the liquid material of the alcohol solution for forming the above-mentioned coated film, it becomes possible to form the stable film in which the alkaline metal salt and ZnO nano particles are dispersed homogeneously to have a suitable film thickness, thereby attaining a high efficiency of the organic electronic device.

It is preferable that the above-mentioned organic polymer binder is soluble in alcohol which is a solvent for the liquid material to be coated. In particular, it is possible to use polystyrene, polyvinyl alcohol, polyvinyl pyridine, polyvinyl phenol, etc. Of these, poly(4-vinylpyridine) is suitable which is used for a surfactant, an adhesive, etc.

In the case of using poly (4-vinylpyridine), it is preferable to have a molecular weight of around 10,000 to 100,000 in terms of solubility in alcohol, dispersibility of the alkaline metal salt and ZnO nano particles, film forming property, etc.

Further, poly(2-vinylpyridine) and polyethylene oxide can also be suitably used in terms of the improvement effect of the electron injection property.

A loading of the above-mentioned organic polymer binder is sufficient in so far as the dispersibility and film forming property of the alkaline metal salt and ZnO nano particles can be improved, and it is preferable that the loading is 5 to 30 wt % of that of the ZnO nano particles.

Although a type of alcohol used as the solvent for the above-mentioned liquid material is not particularly limited, but the alkaline metal salt and ZnO nano particles, and the above-mentioned polymer binder need to be soluble. Further, it is preferable to select and use an alcohol whose volatility is comparatively high, allowing a good film having a flat and smooth surface to be formed after drying. As examples of alcohols, there may be mentioned methanol, ethanol, 2-ethoxyethanol, isopropyl alcohol, etc. Of these, 2-ethoxyethanol is used suitably.

Further, the structure of the electron injection layer or electron transport layer as described above can suitably be applied to an organic electronic device in which the organic layers include a structure where a plurality of active layers are stacked, i.e. a so-called stack type organic electronic device.

As examples of the devices, there may be mentioned a multi-photon organic EL element, a tandem type organic thin film solar cell, etc.

In many cases, as for the organic electronic device which has such a stack structure, a metal, a metal oxide material, etc. should be formed as a film by a deposition method, and an organic layer should be formed as a film by a coating method. In a hybrid organic electronic device employing such combinations of "deposition/coating" and "inorganic material/organic material", adhesion between a lower layer and an upper layer is important. If this is the case, formation of such an electron injection layer or an electron transport layer allows the adhesion between adjoining layers to be improved, while maintaining the uniformity of those films, and it is possible to form a stable film, thereby improving device efficiencies.

The electrode of the organic electronic device in accordance with the present invention may be a known material and have a known structure in each device, and is not limited in particular. For example, in the case of the organic EL element, a so-called ITO substrate is commonly employed where a transparent conductive thin film is formed on a transparent substrate made of glass or polymer, and an indium tin oxide (ITO) electrode is formed on the glass substrate as an anode plate. On the other hand, a cathode is formed of a metal, such as Al with a lower work function (4 eV or less), an alloy, a conductive compound, etc.

EXAMPLES

Hereinafter, the present invention will be described more particularly with reference to Examples. In the following, an organic EL element and an electron injection layer of organic electronic devices are illustrated, however, the present invention is not limited thereto.

(Sample 1) Deposition Method Ca

An organic EL element having a layer structure as shown in FIG. 1 was prepared where Ca formed as a film by a deposition method was used as an electron injection layer.

First, a patterned ITO substrate 1 (thickness of ITO film: 110 nm, element area: 10×10 $mm^2$, luminescence area: 2×2 $mm^2$) was subjected to in order of acetone ultrasonic wave washing for 20 minutes, scrub by alkali detergent, alkali detergent ultrasonic wave washing for 20 minutes, acetone ultrasonic wave washing for 20 minutes, isopropyl alcohol (IPA) ultrasonic wave washing for 20 minutes, and UV ozone washing for 20 minutes.

On the thus washed ITO substrate, five drops of PEDOT:PSS were dropped through a PVDF 0.45 μm filter with a plastic syringe, spin-coated at 500 rpm for 1 second and at 4000 rpm for 40 seconds, and dried at 120° C. for 20 minutes to form a hole injection layer 2 having a film thickness of 40 nm.

Next, 30 mg of a fluorene type polymer (F8BT) expressed by (Chemical Formula 2) as a green fluorescence polymer material was added to 2.5 ml of anhydrous paraxylene, and the mixture was agitated at 70° C. for 1 hour, to prepare a 1.2 wt % (12 mg/ml) solution. Five drops of this solution were dropped through a PVDF 0.45 μm filter with a plastic syringe on the above-mentioned hole injection layer (PEDOT:PSS), spin-coated at 500 rpm for 1 second and at 1400 rpm for 40 seconds, and dried at 70° C. for 30 minutes to form a luminescence layer 3 having a film thickness of 80 nm.

[Chemical Formula 2]

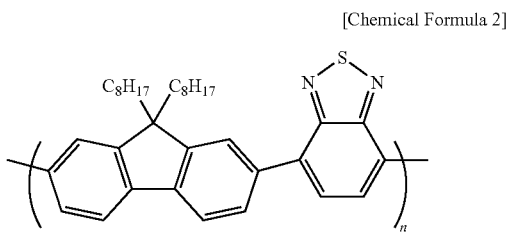

On the above-mentioned luminescence layer (F8BT), Ca was deposited at a deposition rate of 2 Å/s by a resistance heating method under a vacuum of $5\times10^{-6}$ Torr or less to form an electron injection layer 4 having a film thickness of 10 nm.

Then, on the above-mentioned electron injection layer (Ca), Al was deposited at a deposition rate of 5 Å/s with the resistance heating method under a vacuum of $5\times10^{-6}$ Torr or less to form a cathode 5 having a film thickness of 100 nm.

The layer structure of the thus prepared organic EL element may be simply expressed as ITO (110 nm)/PEDOT (40 nm)/F8BT (80 nm)/Ca (10 nm)/Al (100 nm).

(Sample 2) Coating Method $Cs_2CO_3$

As an electron injection layer, a film consisting of $Cs_2CO_3$ (instead of Ca in Sample 1) by a coating method was formed by the following method to prepare an organic EL element. Other processes were similar to those for Sample 1.

After dissolving 10 mg of $Cs_2CO_3$ in 1 ml of 2-ethoxyethanol, the mixture was diluted 5 folds and agitated at 70° C. for 1 hour to prepare 0.2 wt % (2 mg/ml) of solution. 50 μl of this solution was dropped with a micropipette on the luminescence layer (F8BT), spin-coated at 500 rpm for 1 second, and then at 4000 rpm for 40 seconds to form an electron injection layer of a very thin film having a thickness of 1 nm or less.

The layer structure of this organic EL element may be simply expressed as ITO (110 nm)/PEDOT (40 nm)/F8BT (80 nm) /$Cs_2CO_3$ (1 nm or less)/Al (100 nm).

(Sample 3) Coating Method ZnO

Based on a reference document (Nano Lett, VoL, 5, No, 12, 2005, pp. 2408-2413), ZnO nano particles were prepared by a method shown in the following synthesis scheme.

First, 1.67 g (9.10 mmol) of zinc acetate ($Zn(Ac)_2$) and 300 μl of water were added to 84 ml of methanol, and the mixture was agitated and heated to 60° C., into which a solution obtained by dissolving 0.978 g (17.43 mmol) of potassium hydroxide (KOH) in 46 ml of methanol was dropped for 10 to 15 minutes. After agitating it at 60° C. for 2 hours and 15 minutes, white nano particles of ZnO having a particle diameter of from 5 to 6 nm were obtained.

[Chemical Formula 3]

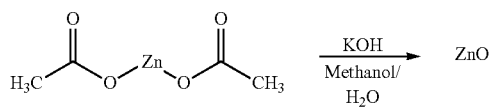

Similarly to the film forming method using $Cs_2CO_3$ in Sample 2, using the thus prepared ZnO nano particles, a film consisting of ZnO (instead of $Cs_2CO_3$ in Sample 2) having a film thickness of 10 nm was formed as an electron injection layer by a coating method to prepare an organic EL element. Other processes were similar to those for Sample 2.

The layer structure of this organic EL element may be simply expressed as ITO (110 nm)/PEDOT (40 nm)/F8BT (80 nm)/ZnO (10 nm)/Al (100 nm).

(Sample 4) Coating Method $ZnO:Cs_2CO_3$ (0.2 wt %:0.2 wt %)

According to the following method, a film consisting of $ZnO:Cs_2CO_3$ (instead of $Cs_2CO_3$ in Sample 2) was formed as an electron injection layer by a coating method to prepare an organic EL element. Other processes were similar to those for Sample 2.

Each of 10 mg of ZnO and 10 mg of $Cs_2CO_3$ was dissolved in 1 ml of 2-ethoxyethanol, and then the solution was diluted five folds, agitated at 70° C. for 1 hour to prepare a 0.2 wt % (2 mg/ml) solution. Subsequently, two solutions were mixed one to one, then 50 μl of the mixture was dropped on a luminescence layer (F8BT) with a micropipette, and spin-coated at 500 rpm for 1 second and at 4000 rpm for 40 seconds to form an electron injection layer having a film thickness of 10 nm.

The layer structure of this organic EL element may be simply expressed as ITO (110 nm)/PEDOT (40 nm)/F8BT (80 nm)/$ZnO:Cs_2CO_3$ (0.2 wt %:0.2 wt %, 10 nm)/Al (100 nm).

(Sample 5) Coating Method $ZnO:Cs_2CO_3$ (1 wt %:1 wt %)

A concentration of $ZnO:Cs_2CO_3$ used in the coating method in Sample 4 was changed from 0.2 wt % to 1 wt % to form a film as an electron injection layer and prepare an organic EL element. Other processes were similar to those for Sample 4.

The layer structure of this organic EL element may be simply expressed as ITO (110 nm)/PEDOT (40 nm)/F8BT (80 nm)/$ZnO:Cs_2CO_3$ (1 wt %:1 wt %, 10 nm)/Al (100 nm).

(Sample 6) Coating Method $PV-4Py:ZnO:Cs_2CO_3$ (0.2 wt %:1 wt %:1 wt %)

Similarly to Sample 5, but poly(4-vinylpyridine) (PV-4Py: molecular weight=40000) was added to $ZnO:Cs_2CO_3$, and then a film consisting of $PV-4Py:ZnO: Cs_2CO_3$ was formed as an electron injection layer by the following coating method to prepare an organic EL element. Other processes were similar to those for Sample 5.

Each of 10 mg of ZnO and 10 mg of $Cs_2CO_3$ was dissolved in 1 ml of 2-ethoxyethanol, and the solution was agitated at 70° C. for 1 hour to prepare a 1 wt % (1 mg/ml) solution. While 10 mg of PV-4Py was diluted five folds and agitated at 70° C. for 1 hour to prepare a 0.2 wt % (2 mg/ml) solution with which each of the former solutions was mixed one to one. 50 μl of the resultant solution was dropped by a micropipette on the above-mentioned luminescence layer (F8BT), and spin-coated at 500 rpm for 1 second and at 4000 rpm for 40 seconds to form an electron injection layer having a film thickness of 10 nm.

The layer structure of this organic EL element may be simply expressed as ITO (110 nm)/PEDOT (40 nm)/F8BT (80 nm)/$PV-4Py:ZnO:Cs_2CO_3$ (0.2 wt %:1 wt %:1 wt %, 10 nm)/Al (100 nm) .

(Sample 7) Deposition-Coating Hybrid Multi-photon Structure

Figure 2:
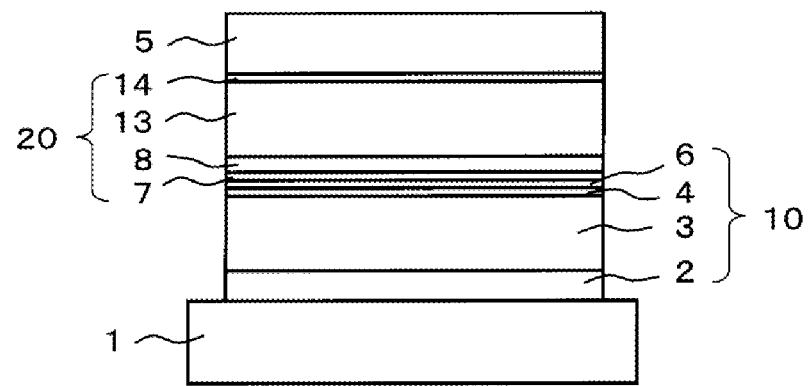
FIG. 2 is a schematic sectional view schematically showing a layer structure of an organic EL element in accordance with Sample 7 in Examples.

An organic EL element having a multi-photon structure provided with units (first unit 10 and second unit 20) including two sets of luminescence layers as shown in FIG. 2 was prepared by the following method.

As with Sample 1, a film of PEDOT:PSS was formed as a hole injection layer 2 on the ITO substrate 1.

Next, 30 mg of a host material F8BT was added to 2.5 ml of anhydrous paraxylene to prepare a 1.2 wt % (12 mg/ml) solution, to which 0.3 mg of yellow fluorescence material rubrene (Rub) was added as a dopant, and agitated at 70° C. for 1 hour to prepare a solution having a dopant concentration of 1 wt %. Five drops of this solution were dropped on the above-mentioned hole injection layer (PEDOT:PSS) through a PVDF 0.45 μm filter by a plastic syringe, spin-coated at 500 rpm for 1 second and at 1400 rpm for 40 seconds, and dried at 70° C. for 30 minutes to form a luminescence layer 3 having a film thickness of 80 nm.

Next, each of 10 mg of ZnO and 10 mg of $Cs_2CO_3$ was dissolved in 1 ml of 2-ethoxyethanol, and the solution was agitated at 70° C. for 1 hour to prepare a 1 wt % (1 mg/ml) solution. 10 mg of PV-4Py was diluted five folds and agitated at 70° C. for 1 hour to prepare a 0.2 wt % (2 mg/ml) solution with which each of the former solutions was mixed one to one. 50 μl of the resultant solution was dropped by a micropipette on the above-mentioned luminescence layer (F8BT:Rub), spin-coated at 500 rpm for 1 second and at 4000 rpm for 40 seconds to form an electron injection layer 4 having a film thickness of 10 nm.

On the above-mentioned electron injection layer (PV-4Py:ZnO:$Cs_2CO_3$), Al 6 was deposited at a deposition rate of 5 Å/s under a vacuum of $5\times10^{-6}$ Torr or less by the resistance heating method to form an electron injection layer having a film thickness of 1 nm. Further, $MoO_3$ (electron accepting material) was deposited at a deposition rate of 0.5 Å/s to form a charge generation layer 7 of 10 nm of film thickness.

Then, 10 mg of Poly-TPD for the hole transport polymer material was dissolved in 1 ml of anhydrous 1,2-dichlorobenzene, and the solution was agitated at 70° C. for 1 hour to prepare a 1.0 wt % (10 mg/ml) solution. Five drops of this solution were dropped through a PVDF 0.45 μm filter by a plastic syringe on the above-mentioned charge generation layer ($MoO_3$), spin-coated at 500 rpm for 1 second and at 2000 rpm for 40 seconds, and dried at 70° C. for 30 minutes to form a hole transport layer 8 having a film thickness of 20 nm.

In a similar fashion to that described above, a luminescence layer 13 (F8BT:Rub) was formed again on the above-mentioned hole transport layer (Poly-TPD), then an electron injection layer 14 ($Cs_2CO_3$) and a cathode 5 (Al) were formed as with the processes for Sample 2 to prepare a deposition-coating hybrid multi-photon organic EL element.

The layer structure of this organic EL element may be simply expressed as ITO (110 nm)/PEDOT (40 nm)/F8BT:Rub 1 wt % (80 nm)/PV-4Py:ZnO:$Cs_2CO_3$ (10 nm) /Al (1 nm)/$MoO_3$ (10 nm)/Poly-TPD (20 nm)/F8BT:Rub 1 wt % (80 nm)/$Cs_2CO_3$ (1 nm or less)/Al (80 nm).

(Element Property Evaluation)

Any element of each of the above-mentioned Samples showed good luminescence. Further, property evaluation was performed for each element.

Figure 4:
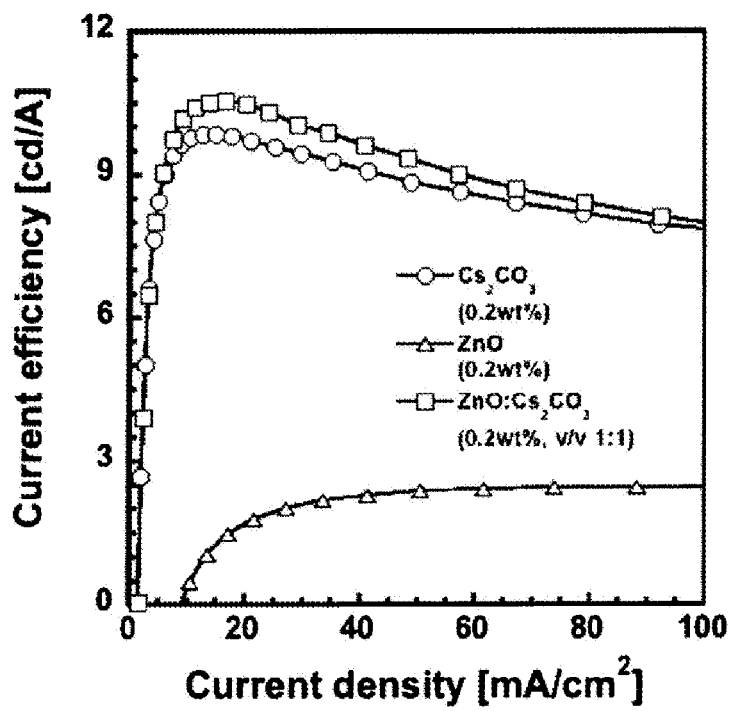
FIG. 4 is a graph showing current efficiency-current density curves of the organic EL element of Samples 2 to 4 in Examples.
Figure 5:
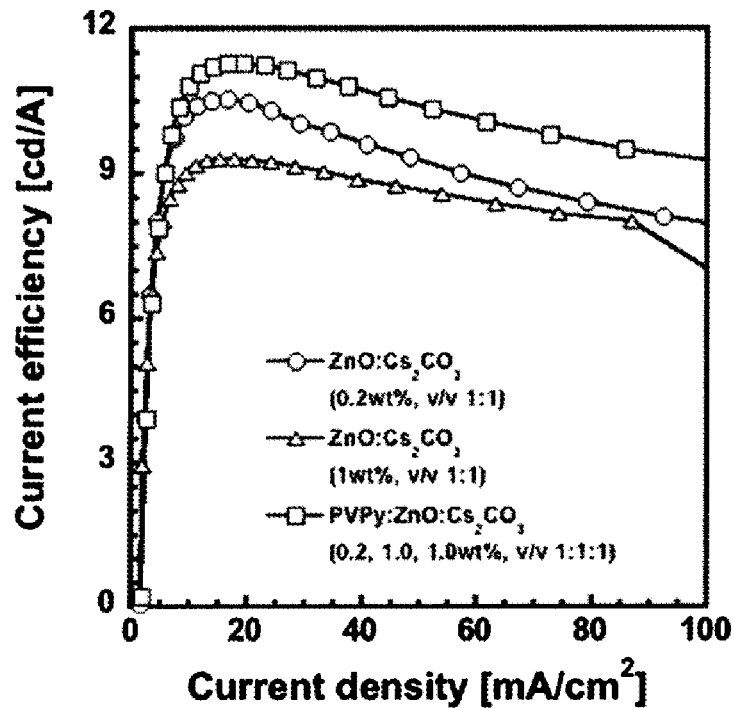
FIG. 5 is a graph showing current efficiency-current density curves of the organic EL element of Samples 4 to 6 in Examples.
Figure 6:
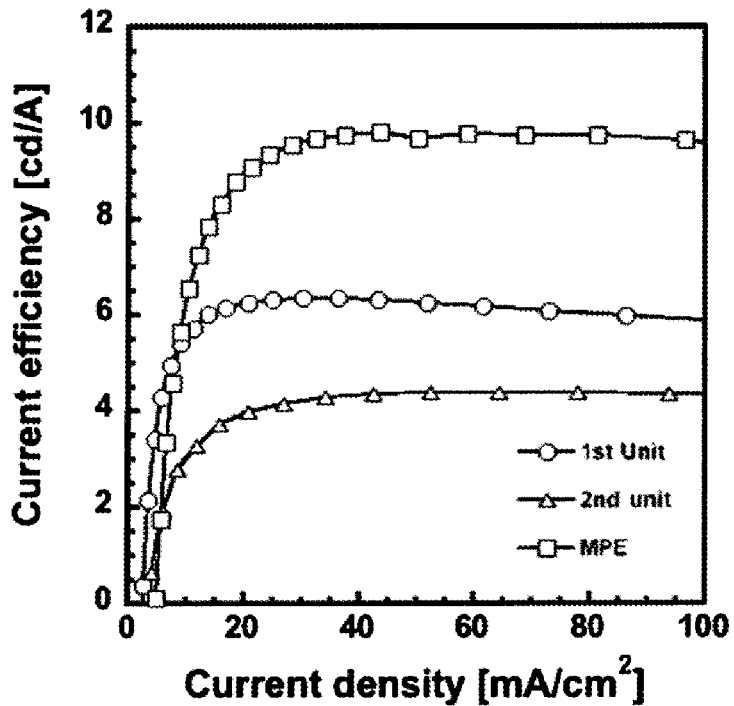
FIG. 6 is a graph showing current efficiency-current density curves of a multi-photon organic EL element of Sample 7 in Examples.

FIGS. 3 to 6 show current efficiency-current density curves of the organic EL elements of Samples 1 to 6. Further, FIG. 6 shows the current efficiency-current density curves of the multi-photon organic EL element of Sample 7.

Furthermore, a summary of the structures of the luminescence layers and electron injection layers of Samples 1 to 6 is collectively shown in Table 1.

TABLE 1

Figure 3:
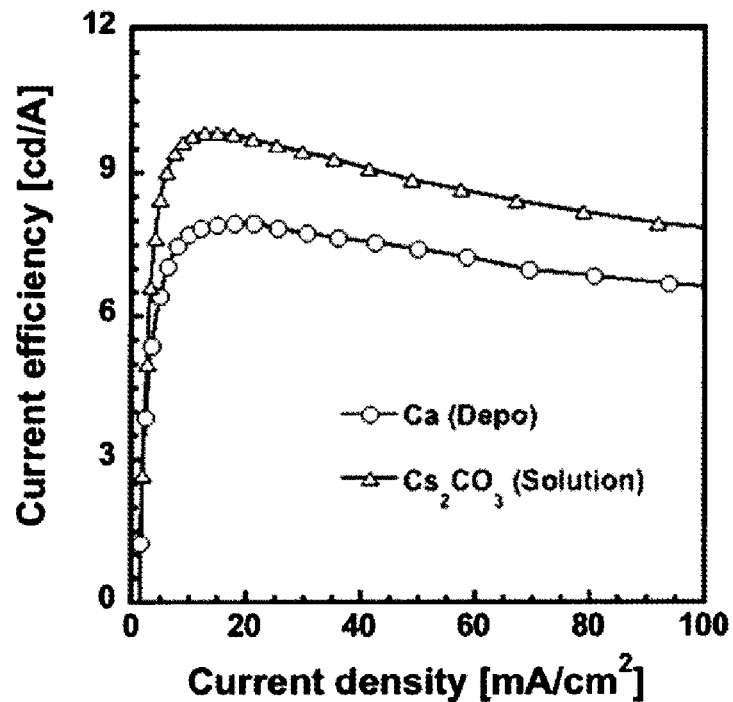
FIG. 3 is a graph showing current efficiency-current density curves of the organic EL elements of Samples 1 and 2 in Examples.

| Sample No. | Luminescence Layer | Electron Injection Layer | Current Efficiency-Current Density | Remarks |
|---|---|---|---|---|
| 1 | F8BT | Deposited Ca | FIG. 3 | |
| 2 | F8BT | 0.2% $Cs_2CO_3$ | FIGS. 3 and 4 | |
| 3 | F8BT | 0.2% ZnO | FIG. 4 | |
| 4 | F8BT | ZnO:$Cs_2CO_3$ (0.2%:0.2%) | FIGS. 4 and 5 | |

TABLE 1-continued

| Sample No. | Luminescence Layer | Electron Injection Layer | Current Efficiency-Current Density | Remarks |
|---|---|---|---|---|
| 5 | F8BT | ZnO:$Cs_2CO_3$ (1%:1%) | FIG. 5 | |
| 6 | F8BT | PV-4Py:ZnO:$Cs_2CO_3$ (0.2%:1%:1%) | FIG. 5 | |
| 7 | F8BT:Rub F8BT:Rub | PV-4Py:ZnO:$Cs_2CO_3$ $Cs_2CO_3$ | FIG. 6 | Multi-Photon |

In the above-mentioned evaluation results, as shown in the graph of FIG. 3, when the electron injection layer was formed of the $Cs_2CO_3$ coated film (Sample 2), it was confirmed that the current efficiency was improved compared with the Ca deposited film (Sample Further, as shown in the graph of FIG. 4, it was confirmed that when the ZnO:$Cs_2CO_3$ (0.2 wt %:0.2 wt %) coated film (Sample 4) was used as the electron injection layer, the current efficiency was improved compared with the $Cs_2CO_3$ coated film (Sample 2).

Furthermore, as shown in the graph of FIG. 5, even when the ZnO and $Cs_2CO_3$ concentrations of the ZnO:$Cs_2CO_3$ coated film of the electron injection layer (Sample 5) were high (1 wt % for each), the improvement in current efficiency was not confirmed. But, when the organic polymer binder was added (Sample 6), the current efficiency was improved.

Still further, as shown in the graph of FIG. 6, in the deposition-coating hybrid multi-photon organic EL element (MPE) (Sample 7) in which the electron injection layer of the first unit was formed of the PV-4Py:ZnO:$Cs_2CO_3$ coated film, the efficiency loss was reduced and the current efficiency substantially twice that of a single unit was obtained.

In the above-mentioned Samples 1 to 7, although F8BT was used as a green fluorescence polymeric material in the luminescence layer, another fluorene green fluorescence polymer (Green Polymer) was used instead. The luminescence layer of each of the following Samples is also the same.

(Sample 8)

30 mg of Green Polymer was added to 2.5 ml of anhydrous paraxylene, which was agitated at 70° C. for 1 hour to prepare a 1.2 wt % (12 mg/ml) solution. Five drops of this solution were dropped through a PVDF 0.45 μm filter with a plastic syringe on the above-mentioned hole injection layer (PEDOT:PSS), spin-coated at 3900 rpm for 30 seconds, and dried at 130° C. for 10 minutes to form a luminescence layer 3 having a film thickness of 80 nm.

Except for this process, an organic EL element was prepared by the processes similar to those for Sample 2.

(Samples 9 to 11)

Using the ZnO nano particles synthesized similarly to Sample 3, 2-ethoxyethanol solutions (0.2, 0.5, 1 wt % (2, 5, 10 mg/ml), respectively) were prepared.

Except for this, each organic EL element was prepared by the processes similar to those for Sample 2.

(Samples 12 to 14)

By the processes similar to those for Sample 4, ZnO:$Cs_2CO_3$ layers (0.2 wt %:0.2 wt %, 0.5wt %:0.5wt %, 1 wt %:1 wt %, respectively) were formed as electron injection layers to prepare respective organic EL elements.

(Samples 15 to 21)

Except that the electron injection layer was a mixed layer made of a polymer binder, $Cs_2CO_3$ and/or ZnO, each organic EL element was prepared by the processes similar to those for Sample 2.

It should be noted that the spin-coating was carried out at 2000 rpm for 40 seconds in the case of the layer made of the mixture of the polymer binder and ZnO.

(Sample 22)

Using Liq as an electron injection material for the electron injection layer, a 0.2 wt % (2 mg/ml) 2-ethoxyethanol solution was prepared. 50 µl of the resultant solution was dropped by a micropipette on the luminescence layer, spin-coated at 2000 rpm for 40 seconds to form an electron injection layer 4 having a film thickness of 1 to 5 nm, which was exposed to atmosphere. Then, a cathode was formed as a film.

Except for these, each organic EL element was prepared by the processes similar to those for Sample 2.

having a film thickness of 5 nm, and then exposed to atmosphere. Subsequently a cathode was formed as a film.

(Element Property Evaluation)

The elements of Samples 8 to 31 were respectively subjected to property evaluation similarly to Samples 1 to 7.

Each of them demonstrated good luminescence originated from Green Polymer.

FIGS. 7 to 14 show the current efficiency-current density curves of the organic EL elements of Samples 8 to 31.

Furthermore, a summary of the structures of the luminescence layers and electron injection layers of Samples 8 to 31 is collectively shown in Table 2.

TABLE 2

Figure 7:
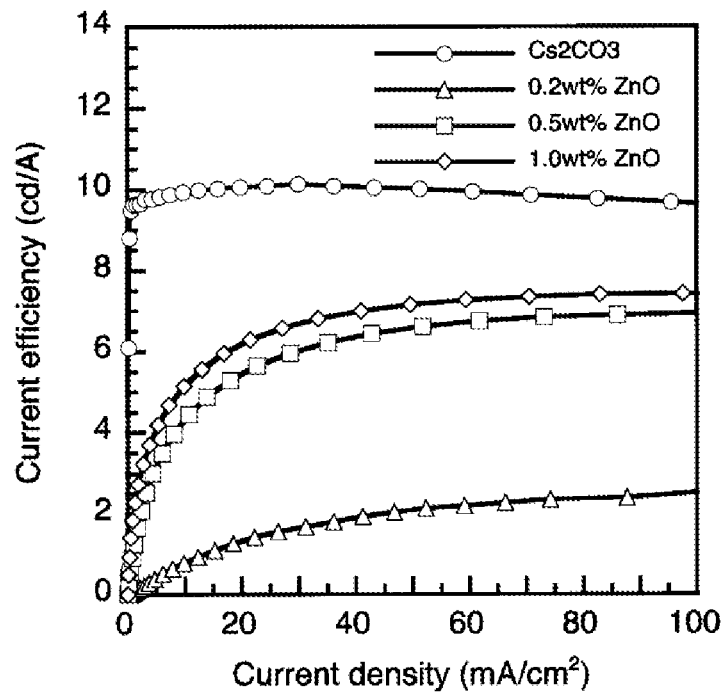
FIG. 7 is a graph showing current efficiency-current density curves of organic EL elements of Samples 8 to 11 in Examples.
Figure 8:
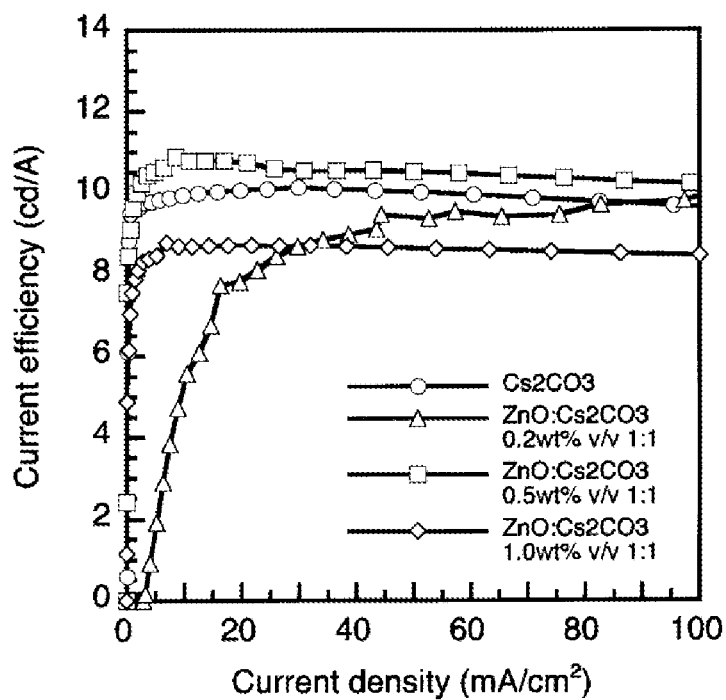
FIG. 8 is a graph showing current efficiency-current density curves of the organic EL elements of Samples 8, 12 to 14 in Examples.
Figure 9:
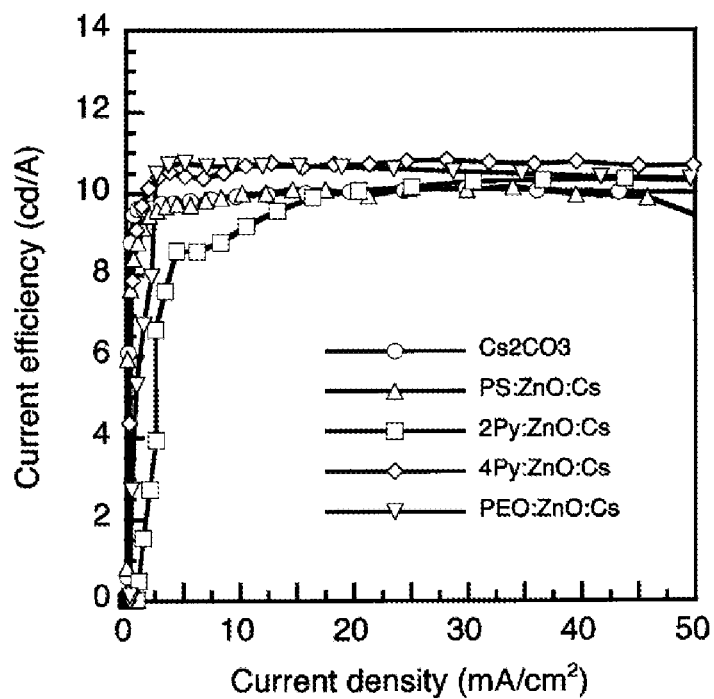
FIG. 9 is a graph showing current efficiency-current density curves of the organic EL element of Samples 8, 15 to 18 in Examples.
Figure 10:
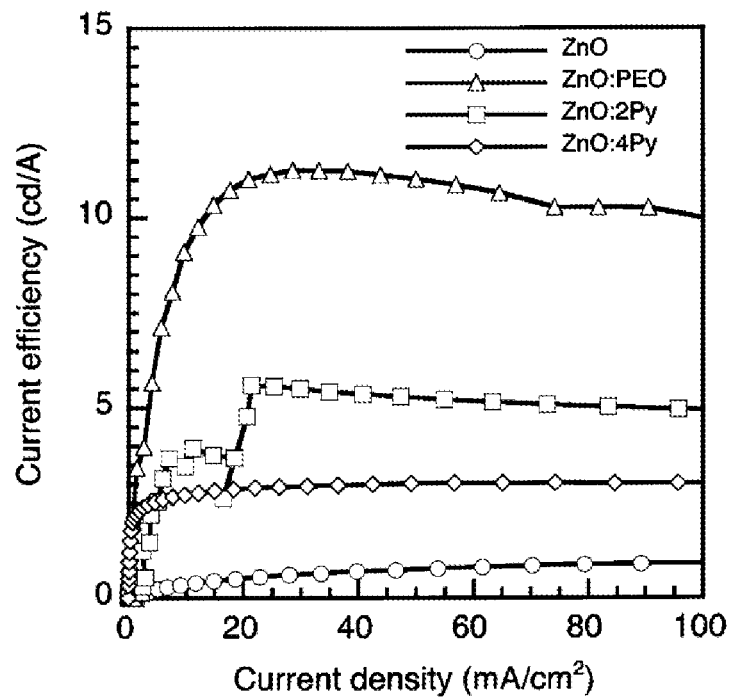
FIG. 10 is a graph showing current efficiency-current density curves of the organic EL elements of Samples 9, 19 to 21 in Examples.
Figure 11:
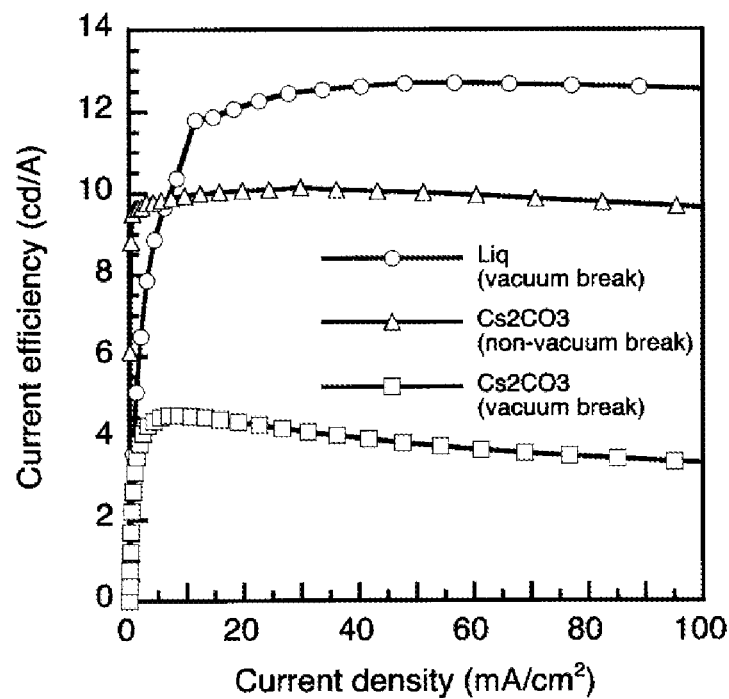
FIG. 11 is a graph showing current efficiency-current density curves of the organic EL elements of Samples 8, 22, and 23 in Examples.
Figure 12:
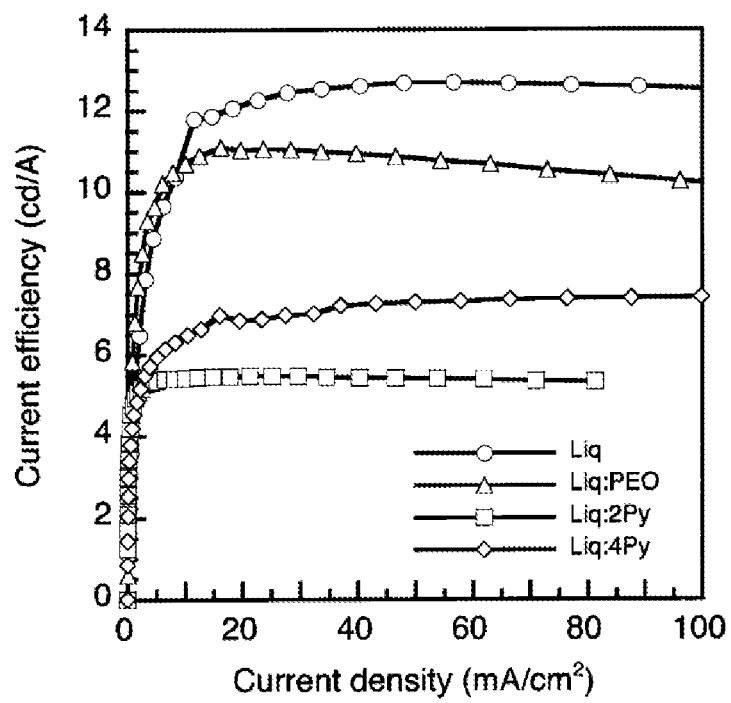
FIG. 12 is a graph showing current efficiency-current density curves of the organic EL elements of Samples 22, 24 to 26 in Examples.
Figure 13:
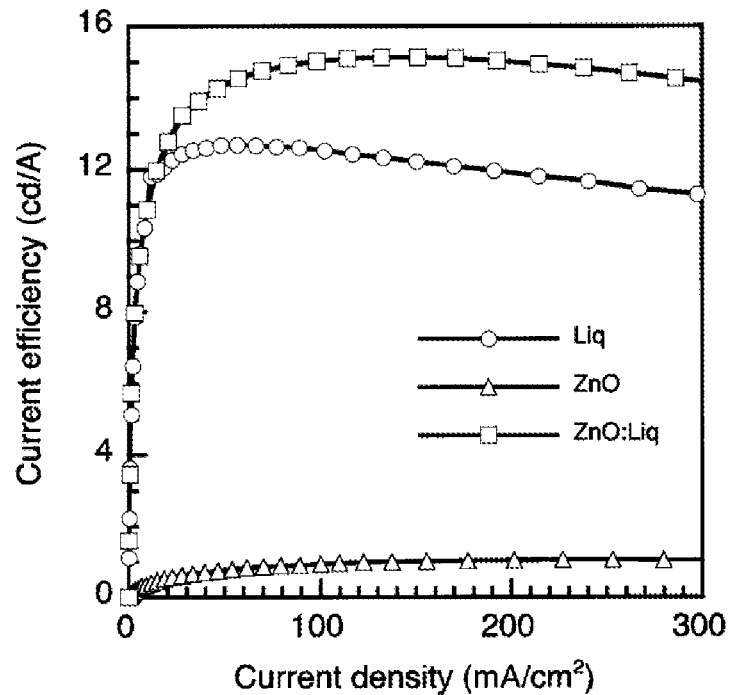
FIG. 13 is a graph showing current efficiency-current density curves of the organic EL elements of Samples 22, 27, and 28 in Examples.
Figure 14:
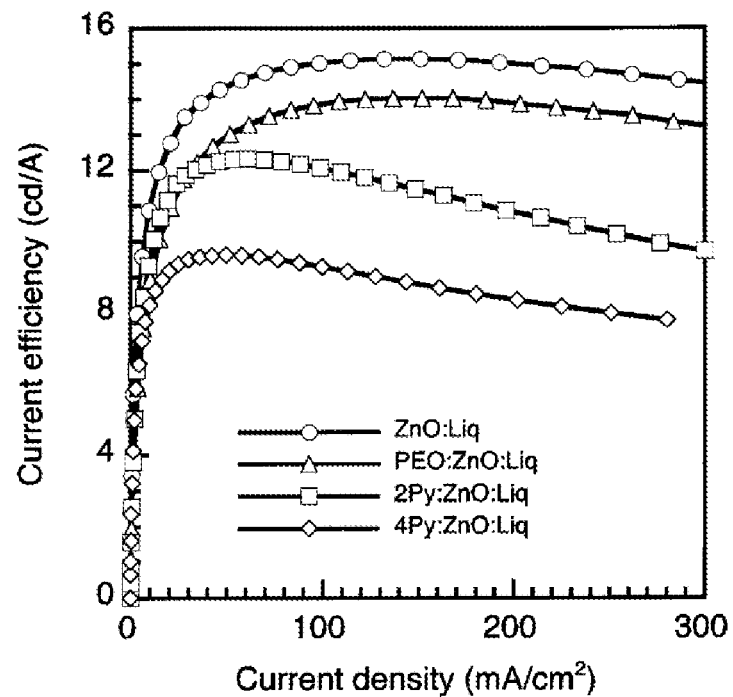
FIG. 14 is a graph showing current efficiency-current density curves of the organic EL elements of Samples 28 to 31 in Examples.

| Sample No. | Luminescence Layer | Electron Injection Layer | Current Efficiency-Current Density |
|---|---|---|---|
| 8 | Green Polymer | 0.2% $Cs_2CO_3$ | FIGS. 7, 8, 9, 11 |
| 9 | Green Polymer | 0.2% ZnO | FIGS. 7, 10 |
| 10 | Green Polymer | 0.5% ZnO | FIG. 7 |
| 11 | Green Polymer | 1% ZnO | FIG. 7 |
| 12 | Green Polymer | ZnO:$Cs_2CO_3$ (0.2%:0.2%) | FIG. 8 |
| 13 | Green Polymer | ZnO:$Cs_2CO_3$ (0.5%:0.5%) | FIG. 8 |
| 14 | Green Polymer | ZnO:$Cs_2CO_3$ (1%:1%) | FIG. 8 |
| 15 | Green Polymer | PS:ZnO:$Cs_2CO_3$ (0.2%:1%:1%) | FIG. 9 |
| 16 | Green Polymer | PV-2Py:ZnO:$Cs_2CO_3$(0.2%:1%:1%) | FIG. 9 |
| 17 | Green Polymer | PV-4Py:ZnO:$Cs_2CO_3$(0.2%:1%:1%) | FIG. 9 |
| 18 | Green Polymer | PEO:ZnO:$Cs_2CO_3$(0.2%:1%:1%) | FIG. 9 |
| 19 | Green Polymer | PV-2Py:ZnO (0.2%:0.5%) Exposed to atmosphere | FIG. 10 |
| 20 | Green Polymer | PV-4Py:ZnO (0.2%:0.5%) Exposed to atmosphere | FIG. 10 |
| 21 | Green Polymer | PEO:ZnO (0.2%:0.5%) Exposed to atmosphere | FIG. 10 |
| 22 | Green Polymer | 0.1% Liq Exposed to atmosphere | FIGS. 11, 12, 13 |
| 23 | Green Polymer | 0.2% $Cs_2CO_3$ Exposed to atmosphere | FIG. 11 |
| 24 | Green Polymer | PEO:Liq (0.2%:0.2%) Exposed to atmosphere | FIG. 12 |
| 25 | Green Polymer | PV-2Py:Liq (0.2%:0.2%) Exposed to atmosphere | FIG. 12 |
| 26 | Green Polymer | PV-4Py:Liq (0.2%:0.2%) Exposed to atmosphere | FIG. 12 |
| 27 | Green Polymer | 0.5% ZnO Exposed to atmosphere | FIG. 13 |
| 28 | Green Polymer | ZnO:Liq (1%:0.2%) Exposed to atmosphere | FIGS. 13, 14 |
| 29 | Green Polymer | PEO:ZnO:Liq (0.2%:1%:0.2%) Exposed to atmosphere | FIG. 14 |
| 30 | Green Polymer | PV-2Py:ZnO:Liq (0.2%:1%:0.2%) Exposed to atmosphere | FIG. 14 |
| 31 | Green Polymer | PV-4Py:ZnO:Liq (0.2%:1%:0.2%) Exposed to atmosphere | FIG. 14 |

(Sample 23)

Similarly to Sample 8, but $Cs_2CO_3$ was spin-coated for the electron injection layer, and then exposed to atmosphere. Subsequently, a cathode was formed as a film.

Except for these, each organic EL element was prepared by the processes similar to those for Sample 2.

(Samples 24 to 30)

The electron injection layers were made of a polymer binder and Liq (Samples 24 to 26), ZnO only (Sample 27), ZnO and Liq (Sample 28), and a polymer binder, Liq, and $Cs_2CO_3$ (Samples 29 to 31), mixed layers.

The polymer binder and Liq were mixed to prepare a 0.2 wt % (2 mg/ml) 2-ethoxyethanol solution. ZnO was dissolved to prepare 0.5 and 1 wt % (5 and 10 mg/ml) 2-ethoxyethanol solutions respectively. The solutions were mixed one to one as desired. 50 µl of each of the resultant solutions was dropped by a micropipette on the luminescence layer, spin-coated at 2000 rpm for 40 seconds to form an electron injection layer 4

From the above-mentioned evaluation results, it is likely that the higher the ZnO concentration of the solution for the electron injection layer, the more efficient. However, it is confirmed that the element using $Cs_2CO_3$ is more of brightness and more efficient (see FIG. 7). It is thought that the electron injection property is inferior to that of $Cs_2CO_3$, since a LUMO level of ZnO is 4.0 eV.

Further, despite being insulative, the polymer binder was mixed in the electron injection layer and demonstrated better efficiency and lower voltage than the ZnO single film. Thus, it is thought that film quality was improved (see FIG. 10). Especially, PEO demonstrated a brightness of around 1000 cd/m$^2$ at a drive voltage of 4 V, and the high electron injection effect was confirmed.

Furthermore, since Liq is stable in the atmosphere and demonstrates lower voltage and higher efficiency than $Cs_2CO_3$ which is not exposed to atmosphere, it is possible to prepare elements while being exposed to the atmosphere. Thus, it can be said that it is useful as a coating-type electron injection material (see FIG. 11).

Still further, it was confirmed that the ZnO:Liq layer demonstrated lower voltage and higher efficiency than the Liq single layer (see FIG. 13). Thus, it is suggested that ZnO:Liq is n-doped. Further, it is thought that it is stable in the atmosphere and a disadvantage that ZnO is unstable to oxygen is mitigated by Liq.

Furthermore, the ZnO:Liq layer having a film thickness of 10 nm which is around 10 times that of the conventionally used electron injection layer has the good electron injection property. Even in the case where PEO is used as a polymer binder to have a film thickness of 10 nm, it is confirmed that it similarly maintains the excellent electron injection property (see FIG. 14). In addition, it is confirmed that Naq, Lipp, or Libpp provides similar effects.

DESCRIPTION OF REFERENCE NUMERALS

1: ITO substrate
2: hole injection layer
3, 13: luminescence layers
4, 14: electronic injection layers
5: cathode
6: Al layer
7: charge generation layer
8: hole transport layer
10: first unit
20: second unit

The invention claimed is:

1. An organic electronic device comprising a pair of electrodes, a substrate, and at least one organic layer between said electrodes, comprising an electron injection layer or electron transport layer formed of a coated film of an alkaline metal salt and zinc-oxide nano particles.

2. An organic electronic device as claimed in claim 1, wherein said coated film contains an organic polymer binder.

3. An organic electronic device as claimed in claim 1, wherein said alkaline metal salt is cesium carbonate, sodium 8-quinolinolate or lithium 8-quinolinolate, or a lithium phenolate salt which is either lithium 2-(2-pyridyl) phenolate, or lithium 2-(2',2"-bipyridine-6'-yl) phenolate.

4. An organic electronic device as claimed in claim 1, wherein said coated film has a thickness of 1 to 30 nm.

5. An organic electronic device as claimed in claim 2, wherein said organic polymer binder is selected from the group of poly(4-vinylpyridine), poly(2-vinylpyridine), and polyethylene oxide.

6. An organic electronic device as claimed in claim 1, wherein said organic layer includes a stack type structure in which a plurality of active layers are stacked.

7. An organic electronic device as claimed in claim 1, wherein said organic electronic device is an organic electroluminescence element, and said organic layer includes a multi-photon structure in which a plurality of luminescence layers are stacked.

8. A method for manufacturing an organic electronic device as claimed in claim 1, wherein formation of the electron injection layer or the electron transport layer is carried out by application of an alcohol-borne liquid material.

* * * * *